United States Patent
Sugimoto et al.

(10) Patent No.: US 6,984,453 B2
(45) Date of Patent: Jan. 10, 2006

(54) ELECTROLYTE COPPER FOIL HAVING CARRIER FOIL, MANUFACTURING METHOD THEREOF, AND LAYERED PLATE USING THE ELECTROLYTE COPPER FOIL HAVING CARRIER FOIL

(75) Inventors: Akiko Sugimoto, Ageo (JP); Junshi Yoshioka, Ageo (JP); Makoto Dobashi, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 185 days.

(21) Appl. No.: 10/467,670

(22) PCT Filed: Dec. 12, 2002

(86) PCT No.: PCT/JP02/13005

§ 371 (c)(1),
(2), (4) Date: Aug. 11, 2003

(87) PCT Pub. No.: WO03/053680

PCT Pub. Date: Jul. 3, 2003

(65) Prior Publication Data

US 2004/0067377 A1 Apr. 8, 2004

(30) Foreign Application Priority Data

Dec. 20, 2001 (JP) ............................. 2001-387839

(51) Int. Cl.
*B32B 15/04* (2006.01)
*C25D 3/38* (2006.01)

(52) U.S. Cl. ...................... 428/469; 428/674; 428/457; 428/926; 428/935; 428/938

(58) Field of Classification Search ................ 428/469, 428/674, 457, 926, 935, 938
See application file for complete search history.

(56) References Cited

U.S. PATENT DOCUMENTS 2,593,829 A * 4/1952 Arledter et al. ............. 428/457

FOREIGN PATENT DOCUMENTS

| EP | 960725 A2 | 12/1999 |
|---|---|---|
| EP | 1133220 A2 | 9/2001 |
| EP | 1133220 A2 * | 9/2001 |
| JP | 11-317574 | 11/1999 |
| JP | 2000-309898 | * 11/2000 |
| WO | WO 01/21859 A1 | 3/2001 |

* cited by examiner

*Primary Examiner*—Robert R. Koehler
(74) *Attorney, Agent, or Firm*—Rothwell, Figg, Ernst & Manbeck, P.C.

(57) ABSTRACT

An object is the provision of a peelable electrodeposited copper foil with carrier foil that stabilizes the peel strength between the carrier foil and the electrodeposited copper foil layer even when used in manufacture of the printed wiring boards that requires pressing at the temperatures of 200° C. or higher. For the purpose of achieving the object, the electrodeposited copper foil with carrier foil 1, which includes an adhesive interface layer 4 arranged on one face of the carrier foil 2 and an electrodeposited copper foil layer 3 arranged on the adhesive interface layer 4, characterized in that the adhesive interface layer 4 is composed of a metal oxide layer ML and an organic material layer OL, and the like are used.

22 Claims, 5 Drawing Sheets

US 6,984,453 B2

ELECTROLYTE COPPER FOIL HAVING CARRIER FOIL, MANUFACTURING METHOD THEREOF, AND LAYERED PLATE USING THE ELECTROLYTE COPPER FOIL HAVING CARRIER FOIL

CROSS REFERENCE TO RELATED APPLICATION

This application is a 35 USC § 371 National Phase Entry Application from PCT/JP02/13005, filed Dec. 12, 2002, and designating the U.S.

TECHNICAL FIELD

The present invention relates to electrodeposited copper foil with carrier foil, a manufacture method of the electrodeposited copper foil with carrier foil, a laminate utilizing the electrodeposited copper foil with carrier foil, and the like.

BACKGROUND ART

Conventionally, electrodeposited copper foil with carrier foil has been used as basic material for manufacturing printed wiring boards which are widely used in the fields of electric and electronic industries. In general, electrodeposited copper foils are bonded to glass-epoxy substrates, phenolic substrates, and insulating substrates made of polymers including polyimide, by means of hot pressing, to be utilized for manufacture of printed wiring boards as copper clad laminates.

In the hot pressing, copper clad laminates are obtained in such a way that copper foils, prepregs (substrates) cured to B-stage, and additional end plates to serve as spacers are laminated in multiple layers, and thermal compression is applied to bond the multiple layers of copper foils and prepregs under the high temperature atmosphere (hereafter, this process will sometimes be referred to as "pressing"). In this connection, if wrinkles are present on the copper foils, cracks are generated in the wrinkled portions in the copper foils, which sometimes causes such inconveniences that resin exudes from the prepregs, and wiring breaking in formation circuits occurs in the printed wiring board manufacturing process that is an etching process to be conducted subsequently.

Wrinkle generation in copper foils becomes a serious problem as the copper foils become thinner. Electrodeposited copper foils with carrier foil have won attention as such epoch-making copper foils that overcome the above described problems and can prevent the foreign matter contamination of glossy surfaces of copper foils in the time of hot pressing. In other words, electrodeposited copper foils with carrier foil have a configuration in which carrier foils and electrodeposited copper foils are bonded together in a planar shape, and are subjected to pressing with the carrier foils remaining attached, and the carrier foils can be removed immediately before the formation of copper circuits by etching. Thus, the prevention of wrinkle generation both at the time of handling and at the time of pressing of electrodeposited copper foils and the prevention of surface contamination of copper clad laminates become possible.

In the specification concerned, the designation of "carrier foil" is employed; the carrier foil is utilized in the form of being bonded to electrodeposited copper foils in a shape as close as possible to a planar shape. The "carrier foil" in the specification concerned has the following characteristics. A consideration of the manufacture method of the electrodeposited copper foil with carrier foil according to the present invention reveals that the carrier foil is required to have at least electric conductivity because copper component is electrodeposited on the carrier foil surface to form the electrodeposited copper foil. Besides, the electrodeposited copper foil with carrier foil is subjected to a sequential line of manufacturing processes, and has a role that meanwhile it maintains the state of being bonded to the electrodeposited copper layer at least until the end of the manufacture of copper clad laminates, facilitates the handling, and reinforces the electrodeposited copper foil in all senses; accordingly, the carrier foil is required to have a prescribed strength. Any object that satisfies the above described requirements can be used as "carrier foil," and accordingly, the designation of "carrier foil" is used as a concept widely encompassing conductive films and the like, although metal foils generally tend to be brought to mind as such objects.

The electrodeposited copper foil with carrier foil can be classified broadly into the peelable foil and etchable foil in general. To sum up the difference therebetween, the peelable foil is the one in which the carrier foil is removed by peeling after pressing, while the etchable foil is the one in which the carrier foil is removed by etching after pressing.

The conventional peelable foil, however, is extremely unstable, after pressing, in the values of the peel strength of the carrier foil, and the satisfactory range of peel strength is generally assumed to fall in the range from 50 to 300 gf/cm. On one hand, in extreme cases, it transpires that the carrier foil cannot be peeled and there has been a drawback that it is difficult to obtain targeted peel strengths. The drawback has been the most serious obstruction when the electrodeposited copper foil with carrier foil widely prevails to be used in general purposes.

The cause for the fact that the peel strength of the carrier foil becomes unstable can be interpreted as described below. Conventional electrodeposited copper foils with carrier foil have adopted the structure in which an adhesive interface layer, based on such a metal as represented by zinc, is formed between a carrier foil and an electrodeposited copper foil, irrespective as to whether the peelable foil is concerned or the etchable foil is concerned. Additionally, the choice between the manufacturing of the peelable foil and the manufacturing of the etchable foil has been conducted practically by controlling the amount of metal that is made present in the adhesive interface layer, although there are slight differences depending on the carrier foil types.

The formation of a metal based adhesive interface layer is mainly conducted by the electrolytic deposition based on the electrolysis of a solution containing a prescribed metal element, and thus the electrochemical methods have been adopted. The electrochemical methods, however, find difficulty in extremely small quantity control of electrolytic deposition amount, and accordingly inferior to other technical methods in reproducibility. Furthermore, because the necessary electrolytic deposition amount boundary for the bifurcation between the peelable foil and the etchable foil is, in other words, the small difference in the metal amount present in the adhesive interface layer, it is conceivable that it is difficult to bring forth the stable performance. Furthermore, in general, peeling of the carrier foil is conducted, on completion of the press operation carried out at a temperature of 180° C. or higher, under a high pressure exerted, and for 1 to 3 hours, and accordingly it is possible that the adhesive interface layer gives rise to the mutual diffusion with the carrier foil and electrodeposited copper foil. This rather operates toward enhancing the adhesive strength, and is possibly part of the reason that the peel strength becomes unstable.

In these years, demand for downsizing electric and electronic appliances steadily continues to grow, and accordingly it has become strongly demanded that printed wiring boards as fundamental parts for these appliances be made in multilayer structure, the copper foil circuits thereof be made in high density, and packaging parts be mounted in high packaging density. To meet these demands, heat release from the packaging parts is increased, and hence printed wiring boards as built-in parts are required to have high heat resistance so that high heat resistant substrate including substrates utilizing BT resin, Teflon substrates, polyimide substrates have come to be used. In this connection, generally speaking, the press temperature for copper clad laminates as material for printed wiring boards also tends to become higher. Consideration of the above described matters leads to an anticipation that the use of conventional peelable electrodeposited copper foils with carrier foil will become more and more difficult.

On one hand, in connection with the etchable foil, dedicated etching equipment is needed, and the temporal cost required for etching tends to be high. Consequently, the use of conventional etchable electrodeposited copper foils with carrier foil results in boosting up the overall manufacture cost, and accordingly there has been a drawback that the conventional etchable foils cannot easily be used for an extremely wide range of applications.

The inventors involved in the application concerned, for the purpose of overcoming the above described problems, have proposed and supplied to the market an electrodeposited copper foil with carrier foil which eliminates the drawbacks of conventional peelable electrodeposited copper foils with carrier foil, makes the use thereof possible in a comparable manner with that in the case of the so-called usual use of electrodeposited copper foils, also forms an adhesive interface layer on the carrier foil surface so that the peel strength associated with the interface between the carrier foil and the electrodeposited copper foil can be stabilized to a low level, makes copper deposit electrolytically on the adhesive interface layer, utilizes the deposited copper layer as electrodeposited copper foil, and makes the above described adhesive interface layer by use of organic material (hereinafter, referred to as "electrodeposited copper foil with carrier foil provided with organic adhesive interface layer").

The electrodeposited copper foil with carrier foil, provided with an organic adhesive interface layer, however, is given a relatively low heat resistance temperature for the organic material constituting the organic adhesive interface layer, and the heat resistance temperature of the organic material generally usable for forming the organic adhesive interface is generally limited to the order of 200° C. Therefore, under the existing circumstances, it has been difficult to use organic material for manufacturing Teflon substrates, polyimide substrates and the like, all requiring the press processing at the temperatures higher than the above mentioned limit.

Decomposition of the organic material constituting the organic adhesive interface layer by heating causes the mutual diffusion between the carrier foil and the electrodeposited copper foil, preventing smooth peeling, which has made impossible the use of the electrodeposited copper foil with carrier foil for the purpose of applications expected by nature thereto.

Additionally, as a technique involving a copper foil with carrier foil that allows easy peeling of the carrier foil even after such high temperature pressing, there is proposed independent use of a metal oxide layer for the adhesive interface layer between the carrier foil layer and copper foil layer, as disclosed in EP-1133220. This is a positive application of the characteristics borne by metal oxide that metal oxide is a compound stable at high temperatures and generally hard but brittle to the adhesive interface.

Incidentally, independent use of a metal oxide layer causes the following drawback constituting an obstruction that prevents pursuing the mass productivity involving finished products and improving the production yield. That is, when the thickness of the metal oxide layer exceeds a certain thickness, the peel strength between the carrier foil layer and the copper foil layer is increased, and additionally the peel strength comes to lack stability, and accordingly it becomes difficult to guarantee the quality of peel strength between the carrier foil layer and the copper foil layer.

SUMMARY OF THE INVENTION

Consequently, the inventors according to the present invention, as a result of diligent study, arrived at the development of an electrodeposited copper foil with carrier foil that is a peelable electrodeposited copper foil with carrier foil, and in which the adhesive interface layer can be maintained in a sound state even under application of high temperatures exceeding 200° C., and furthermore, the peel strength between the carrier foil layer and the copper foil layer can be stabilized to a low level and the carrier foil can easily be peeled. Now, the invention will be described.

According to one embodiment of the invention, an electrodeposited copper foil with carrier foil, which comprises an adhesive interface layer on one face of the carrier foil and an electrodeposited copper foil layer arranged on the adhesive interface layer, is characterized in that the adhesive interface layer is composed of a metal oxide layer and an organic material layer.

Figure 1:
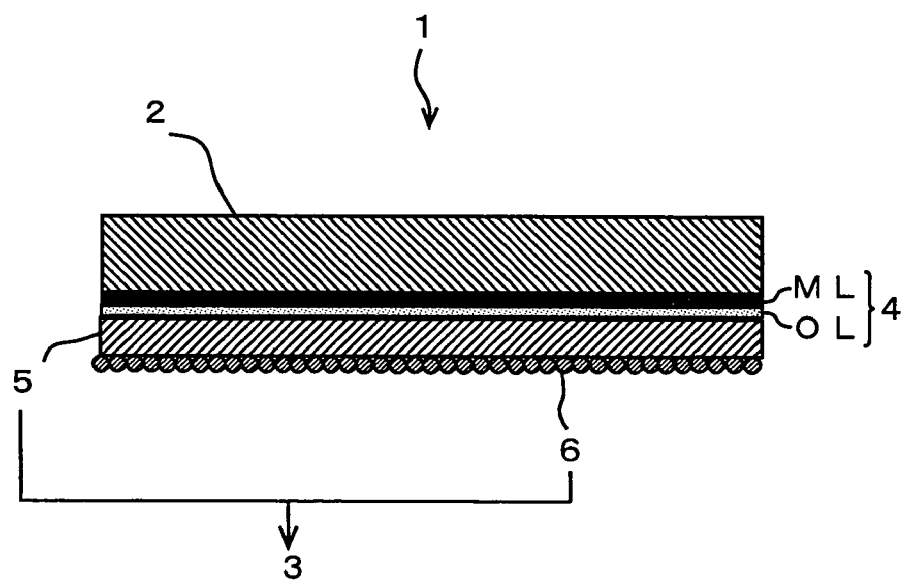
FIGS. 1 and 2 show schematic sectional views of electrodeposited copper foils with carrier foil according to the present invention.

The electrodeposited copper foil with carrier foil 1 according to the present invention has, as FIG. 1 shows a schematic sectional view thereof, a configuration in which a carrier foil 2 and an electrodeposited copper foil 3 are bonded together through the intermediary of an adhesive interface layer 4. And the adhesive interface layer 4 is composed of two layers, namely, a metal oxide layer ML and an organic material layer OL. Both in what precedes and in what follows, an electrodeposited copper foil and an electrodeposited copper foil layer represent an identical portion, and a carrier foil and a carrier foil layer represent another identical portion, an adhesive interface and an adhesive interface layer represent yet another identical portion; any one of the counterpart terms in each case is appropriately adopted according to individual descriptions.

The electrodeposited copper foil with carrier foil 1 according to the present invention is characterized in that the adhesive interface 4 between the carrier foil 2 and the electrodeposited cooper foil 3 is composed of two layers, namely, the metal oxide layer ML and the organic material layer OL. The use of the metal oxide layer ML for the adhesive interface prevents the decomposition and fadeaway of the adhesive interface layer 4, even after the high temperature pressing at a temperature exceeding 200° C. in the copper clad laminate manufacture, and the organic material layer OL serves to stabilize and facilitate the peeling of the carrier foil 2 and the electrodeposited copper foil layer 3 from each other so that the peeling can be conducted under application of a small force.

More specifically, the use of the adhesive interface layer 4 according to the present invention permits controlling the peel strength of the carrier foil 2, after the high temperature pressing at a temperature exceeding 200° C. in the copper clad laminate manufacture, to such a level that the peeling can be easily carried out by human hand. Furthermore, it becomes possible to eliminate completely the condition that the carrier foil 2 cannot be peeled and the fault that some fragments of the carrier foil 2 are left on the copper foil surface after the carrier foil 2 has been peeled.

The use of a metal oxide layer for constitution of the adhesive interface layer 4 leads to no thermal decomposition at the time of the high temperature pressing, thereby to no such complete fadeaway as found in the organic adhesive interface layer formed solely with an organic material, and consequently permits maintaining the adhesion strength, between the carrier foil 2 and the electrodeposited copper foil 3, as obtained at the time of the manufacture of the electrodeposited copper foil with carrier foil 1, to a certain level even after the pressing.

Now, a specific example is described below. A sample was formed in which an adhesive interface layer of the order of about 0.1 $\mu$m of nickel oxide was formed on a 35 $\mu$m carrier foil, and a 9 $\mu$m electrodeposited copper foil was formed (hereinafter referred to as "Sample 1"). Sample 1 thus obtained was bonded to a FR-4 prepreg to be pressed into a copper clad laminate, where the press temperature was varied and the peel strength between the carrier foil and the electrodeposited copper foil layer was examined at 20 different points in temperature, yielding the results including the following data: under the press condition of 175° C.×1 hour, the obtained average peel strength was found to be 3.6 gf/cm (standard deviation: 0.15 gf/cm); under the press condition of 185° C.×1 hour, the obtained average peel strength was found to be 3.7 gf/cm (standard deviation: 0.21 gf/cm); under the press condition of 195° C.×1 hour, the obtained average peel strength was found to be 4.0 gf/cm (standard deviation: 0.38 gf/cm); under the press condition of 220° C.×1 hour, the obtained average peel strength was found to be 4.3 gf/cm (standard deviation: 0.81 gf/cm); thus, it has been revealed that there is found no large variation in the peel strength. On the other hand, an electrodeposited copper foil with carrier foil comprising an organic adhesive interface formed by using solely CBTA for the adhesive interface (hereinafter referred to as "Sample 2") was examined for the peel strength between the carrier foil and the electrodeposited copper foil layer under similar conditions, yielding the results including the following data: under the press condition of 175° C.×1 hour, the obtained average peel strength was found to be 4.5 gf/cm (standard deviation: 0.03 gf/cm); under the press condition of 185° C.×1 hour, the obtained average peel strength was found to be 15.8 gf/cm (standard deviation: 0.05 gf/cm); under the press condition of 195° C.×1 hour, the obtained average peel strength was found to be 80.0 gf/cm (standard deviation: 0.05 gf/cm); under the press condition of 220° C.×1 hour, the obtained peel strength came to prohibit peeling.

Incidentally, as for the peel strength for the copper clad laminate prepared by using the above exemplified Sample 1, on focusing attention on the standard deviations representing the dispersion of the peel strength at the individual press temperatures, it has been found that the values of the standard deviation increases with increasing press temperature, and at the temperature of 220° C., the peel strength dispersion becomes very large, even though peeling is possible. On the contrary, as for the peel strength for the copper clad laminate prepared by using Sample 2, it has been found that the standard deviations representing the dispersion of the peel strength at the individual press temperatures show small values, and the peel strength dispersion becomes small, although for the press temperature of 220° C., peeling itself is prohibited.

On the basis of the above described results, the inventors involved in the application concerned have considered that the following phenomena probably occur. In the case where a metal oxide is used alone for the adhesive interface layer, as in Sample 1, peeling of the carrier foil layer from the electrodeposited copper foil layer is surely possible even when there has been conducted such high temperature pressing as adopted in current manufacturing sites for printed wiring boards. However, the thickness control and uniformity control for the metal oxide layer are difficult, and furthermore, when the metal oxide layer is formed, the development of the bonding between the metal and oxygen is probably accompanied by the crystal lattice deformation, leading to microcrack generation. The metal oxide layer with generated microcracks suffers from thermal shock at the time of pressing, and furthermore, microcrack propagation occurs as a result of the loaded high pressure; in the portions having once suffered from cracks in the metal oxide layer, the constituent components of the carrier foil and electrodeposited copper foil layer are pushed out into the cracks; mutual contact of the pushed out portions develop the mutual diffusion, and the so-called solid phase diffusion occurs to form the partially diffusion bonded state, and consequently, it is considered that the above described peel strength dispersion becomes large.

Following the above considerations, even when cracks are generated in an adhesive interface layer formed using oxides of metals including nickel, it is conceivable that a measure has only to be adopted for suppressing the development of the mutual diffusion between the carrier foil and the electrodeposited copper foil layer, in the portions where cracks have been generated. In general, the mutual diffusion of metals shows only the diffusion velocity increase with increasing temperature in a high temperature and pressurized state, and occurs in nature even at low temperatures although it might be small. Accordingly, the inventors involved in the application concerned, as can be seen from the schematic sectional diagram shown in FIG. 1, have designed the suppression of the mutual diffusion, as termed as such here, by arranging an organic material layer on the face, in contact with the electrodeposited copper foil layer, of the metal oxide layer in the adhesive interface layer.

The organic material layer is, when exposed to a heating environment where the temperature is equal to or higher than a certain value, probably decomposed and fades away, and can scarcely remain in a high temperature environment where the temperature is equal to or higher than 200° C., except for some types of organic materials. The present inventors, however, have considered that by adopting such a laminate configuration as that in the electrodeposited copper foil with carrier foil according to the present invention, the direct contact between the metal component in the carrier foil layer and the metal component in the electrodeposited copper foil layer can be prevented when the organic material layer is formed, until the organic material component infiltrates into the cracks generated in the metal oxide layer and eventually fades away completely, thereby leading to the retardation of the mutual diffusion generation between both metal components.

Accordingly, an electrodeposited copper foil with carrier foil, according to the present invention, was formed in which a nickel oxide layer of the order of about 0.1 μm was formed on a 35 μm carrier foil, a 3 nm thick organic material layer was formed on the nickel oxide layer, and a 9 μm electrodeposited copper foil layer was formed on the organic material layer. Similarly to the above described cases of Sample 1 and Sample 2, the electrodeposited copper foil with carrier foil thus obtained was bonded to a FR-4 prepreg to be pressed into a copper clad laminate, where the press temperature was varied and the peel strength between the carrier foil and the electrodeposited copper foil layer was examined at 20 different points in temperature, yielding the results including the following data: under the press condition of 175° C.×1 hour, the obtained average peel strength was found to be 3.2 gf/cm (standard deviation: 0.11 gf/cm); under the press condition of 185° C.×1 hour, the obtained average peel strength was found to be 3.3 gf/cm (standard deviation: 0.12 gf/cm); under the press condition of 195° C.×1 hour, the obtained average peel strength was found to be 3.5 gf/cm (standard deviation: 0.15 gf/cm); under the press condition of 220° C.×1 hour, the obtained average peel strength was found to be 4.0 gf/cm (standard deviation: 0.18 gf/cm); as can be seen from the above data, the peel strength is not varied largely, and additionally the standard deviations are extremely small, indicating that the stability of the peel strength has been remarkably improved.

Now, for constitution of the adhesive interface layer 4, the metal oxide layer can utilize the metal oxides of nickel, chromium, titanium, magnesium, iron, cobalt, and tungsten, or the oxides of the alloys including these elements. Among these, nickel oxide and cobalt oxide are probably most appropriate at the present stage, when processed into a copper clad laminate by use of the electrodeposited copper foil with carrier foil 1, from the viewpoint that the peel strength after heating between the carrier foil 2 and the electrodeposited copper foil layer 3 is made stable. Furthermore, this is because nickel oxide and cobalt oxide can be said to cause no such inconveniences including deterioration of generally used chemical solutions in the etching process of printed wiring boards.

Besides, it is preferable that a metal oxide layer of 1 nm or more in thickness is used for the metal oxide layer ML constituting the adhesive interface layer 4. With a metal oxide layer less than 1 nm thick, it becomes impossible to stabilize to a low level the peel strength after heating between the carrier foil 2 and the electrodeposited copper foil layer 3. On one hand, the upper limit for the metal oxide layer ML is varied depending on the types of the oxides constituting the metal oxide layer ML; according to the study performed by the inventors involved in the application concerned, when no organic material layer OL is formed, if the metal oxide layer ML exceeds 2 μm in thickness, the dispersion of the peel strength after heating between the carrier foil 2 and the electrodeposited copper foil layer 3 seemingly begins to become large. Therefore, it is probably preferable that the upper limit of the metal oxide layer ML is 2 μm or less.

However, the adhesive interface layer 4, in the case of the electrodeposited copper with carrier foil according to the present invention, is consisted of the metal oxide layer ML and the organic material layer OL. Accordingly, strictly speaking, the thickness of the metal oxide layer ML is determined in consideration of the below described relation in thickness with the organic material layer OL, and furthermore, in consideration of the below described formation method of the electrodeposited copper layer. More specifically, if the bulk copper layer constituting the electrodeposited copper foil layer is formed directly by electrolysis, the adhesive interface layer 4 consisting of the metal oxide layer ML and the organic material layer OL should be made electrically conductive. On the contrary, according to the below described method in which the bulk copper layer of the electrodeposited copper foil layer is made to grow either solely by use of the electroless copper plating method or by adopting the electroless copper plating method and subsequently by use of the electrolytic copper plating, it is not necessarily needed that the adhesive interface layer 4 be made to be in an electrically conductive state. As can be seen from the preceding considerations, it should be thought that the upper limit thickness of the metal oxide layer ML is not needed to be considered exactly, and it suffices that the lower limit thickness is at least 1 nm.

It is preferable that, as described in the claims, the organic material layer OL constituting the adhesive interface layer 4 is formed by use of one type or more than one types of compounds selected from nitrogen containing organic compounds, sulfur containing organic compounds, and carboxylic acids.

Among the nitrogen containing organic compounds, sulfur containing organic compounds, and carboxylic compounds, the nitrogen containing organic compounds include nitrogen containing compounds having substituents. Specifically, it is preferable that as the nitrogen containing compounds, the following triazole compounds having substituents are used: 1,2,3-benzotriazole (hereinafter referred to as "BTA"), carboxybenzotriazole (hereinafter referred to as "CBTA"), N',N'-bis(benzotriazolylmethyl)urea (hereinafter referred to as "BTD-U"), 1H-1,2,4-triazole (hereinafter referred to as "TA"), 3-amino-1H-1,2,4-triazole ("ATA") and the like.

It is preferable that as the sulfur containing compounds, the following compounds are used: mercaptobenzothiazole (hereinafter referred to as "MBT"), thiocyanuric acid (hereinafter referred to as "TCA"), 2-benzimidazolethiol (hereinafter referred to as "BIT"), and the like. Particularly, thoicyanuric acid is excellent in high temperature heat resistance and suitable for the object of the present invention.

It is particularly preferable that monocarboxylic acids are used as the carboxylic acids, and above all, it is preferable to use oleic acid, linoleic acid, and linolenic acid.

The organic material layer as referred to here is a matter which is removed, while remaining attached to the carrier foil, simultaneously when the carrier foil is peeled; however, the organic materials as referred to here are the materials which have been able to be confirmed that these materials have no adverse effects, at the present stage, on the processes including various resist coating processes, etching processes, various plating processes, surface mounting processes and the like, all involved in the manufacturing processes of printed wiring boards subsequent to the processing for formation of copper clad laminates, even if the organic material layer remains left on the surface of the electrodeposited copper foil layer.

These organic materials are generally not conductive materials, but materials having insulating property. Accordingly, the electrodeposited copper foil layer of the electrodeposited copper foil with carrier foil is formed by electrolytic deposition of copper directly on the organic material layer, by polarizing as cathode the carrier foil itself that forms the organic material layer OL, so that it is necessary to establish the condition under which electric conduction can occur through the adhesive interface layer. Accordingly, as a matter of course, there is a limit to the thickness of the adhesive interface layer comprising the organic material layer, and the thickness is required to permit ensuring the appropriate peel strength, and furthermore, stable electrtolytic depositing of copper.

Thus, as for the formation of the organic material layer OL, it is not important what concentration of solution is used and how long processing time is spent for the formation of the adhesive interface layer, but important is the resulting thickness of the formed organic material layer OL; in other words, important is the organic material amount present in the adhesive interface. In this context, it can be decided that the thickness of the organic material layer should be made to fall preferably in the range from 1 nm to 1 $\mu$m.

The thickness range as specified above enables ensuring the peel strength stability, and furthermore, conducting stable electrolytic deposition of copper. More specifically, as for the quantity (thickness) of the organic material used for the adhesive interface layer, with the thickness thinner than the lower limit of 1 nm, the thickness of the organic material layer OL comes to suffer from dispersion, failing to form a uniform adhesive interface layer. Consequently, no stable, appropriate peel strength after pressing can be obtained, sometimes resulting in failure to peel the carrier foil.

When the thickness of the organic material layer exceeds the upper limit of 1 $\mu$m, the conduction condition becomes unstable and hence the copper deposition condition becomes unstable so that it becomes difficult to form an electrodeposited copper foil layer that is uniform in thickness. Additionally, even a long time deposition of copper fails to satisfy the stability of the peel strength. Besides, a further thicker organic material layer OL leads to the condition in which electric conductance becomes completely impossible.

The thickness of the adhesive interface layer is as extremely thin as of the level of nm to $\mu$m, so that the measurement thereof is difficult, but a direct observation thereof is well possible either with a transmission electron-microscope (TEM) or with a so-called FIB apparatus.

Besides, it is preferable to use copper foil for the carrier foil 2. This is because as far as the carrier foil 2 having been subjected to peeling to be removed is a sheet of copper foil, the recycle thereof is an easy task, avoiding wasting of resources. Additionally, it is preferable that the thickness of the copper foil, used as the carrier foil 2 in such a case as described above, is 12 $\mu$m to 70 $\mu$m. With the thickness of the carrier foil 2 thinner than 12 $\mu$m, the handlability thereof is degraded, some sorts of badness including wrinkles and the like tend to occur on the carrier itself when handled, and furthermore, remarkably degraded is the function thereof operative as the support that prevents the electrodeposited copper foil layer from being wrinkled and folded. Additionally with the above mentioned thickness exceeding 70 $\mu$m, the workability is degraded when the carrier foil is removed after bonding to the prepreg having been carried out. The peel strength as witnessed when the carrier foil is being peeled to be removed is determined by the adhesive force, or more strictly, by the adhesive force superposed with the bending stress of the carrier foil itself dependent on the carrier layer thickness. Accordingly, when the carrier foil itself is too thick, the resulting peel strength becomes large, leading to degraded workability.

In the next place, in general, the electrodeposited copper foil layer 3 is composed of a bulk copper layer 5 for use in circuit formation in the form of copper clad laminate, a copper microparticle layer 6 for acquiring anchor effect to enhance the adhesion to an insulating resin material constituting the copper clad laminate, and a surface finishing layer subjected to the treatments including the passivation that is conducted according to the use conditions of the copper foil and to the intended use, and the chemical processing in which the silane coupling agent is utilized to enhance the chemical adhesion to the insulating resin material. FIG. 1 also shows the electrodeposited copper foil with carrier foil that comprises such a general electrodeposited copper foil layer 3 as described here. Incidentally, the surface finishing layer as referred to here is extremely thin and scarcely can be depicted in the figure, so that it is omitted in the figure.

Figure 2:
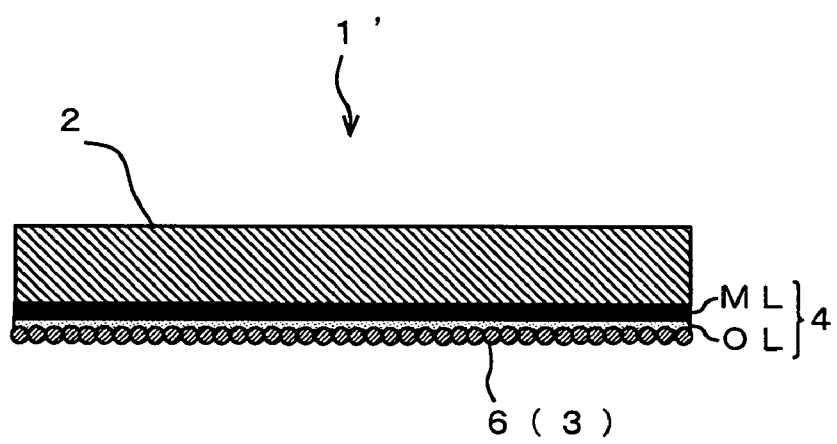

Incidentally, as FIG. 2 shows, it is possible that the above described bulk copper layer 5 in the electrodeposited copper foil layer 3 is omitted, and the electrodeposited copper foil layer 3 is composed of the copper microparticle layer 6 for acquiring anchor effect to enhance the adhesion to the insulating resin material constituting the copper clad laminate and the above described surface finishing layer. Accordingly, it can be perceived from the figure that the copper microparticle layer 6=the electrodeposited copper foil layer 3. The use of the electrodeposited copper foil layer with carrier 1' leads to the exposure of the copper microparticle layer 3 to be the surface, when the carrier foil is peeled after processing into a copper clad laminate. Thus, at this stage, it becomes possible to form the bulk copper layer on the copper microparticle layer 3 by use of the plating method. By processing this way, it becomes possible to yield any arbitrary thickness of the bulk copper layer, and accordingly the adjustment of the thickness of the bulk copper layer can be performed within the etching process in conformity with the fine fabrication level of the circuit to be formed.

Figure 3:
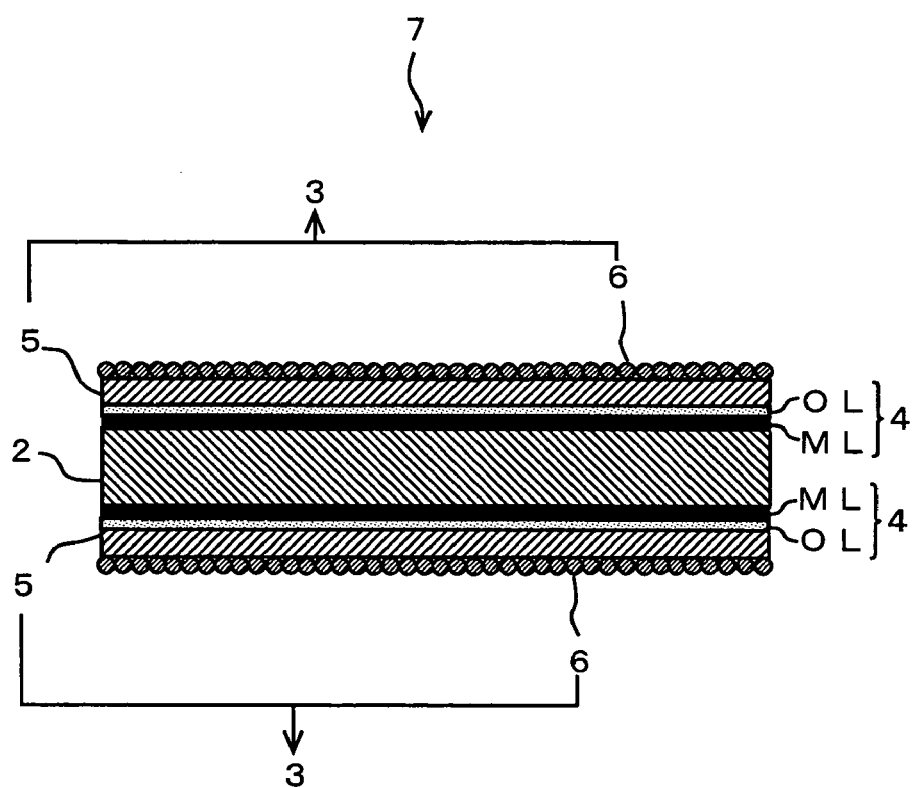
FIG. 3 shows a schematic sectional view of a double-sided electrodeposited copper foil with carrier foil according to the present invention.

Additionally, a double-sided electrodeposited copper foil with carrier foil 7, which comprises adhesive interface layers 4 and in which the adhesive interface layers 4 each is provided with an electrodeposited copper foil layers 3 on both faces of the carrier foil 2, is characterized in that the adhesive interface layers 4 each is composed of a metal oxide layer ML and an organic material layer OL. The schematic sectional diagram of the double-sided electrodeposited copper foil with carrier foil 7 is shown in FIG. 3. Fundamentally, the double-sided electrodeposited copper foil with carrier foil 7 has a structure in which the carrier foil 2, in the electrodeposited copper foil with carrier foil 1 that has been described above, comprises electrodeposited copper foil layers 3 on both faces thereof.

Thus, the double-sided electrodeposited copper foil with carrier foil 7 can share a similar concept with the electrodeposited copper foil with carrier foil 1 in that the adhesive interface layers 4 each is composed of a metal oxide layer ML of 1 nm or more in thickness and an organic material layer of 1 nm to 1 $\mu$m in thickness, and both copper foils with carrier foil are common in that the electrodeposited copper foil layer 3 is composed of a copper microparticle layer 6 and a surface finishing layer provided according to need. The difference is found in that rather thick copper foil of 70 μm to 210 μm is used as the carrier foil 2. The use of such rather thick foil as carrier foil is a result of the below described consideration of the way of use of the double-sided electrodeposited copper foil with carrier foil 7.

Figure 4:
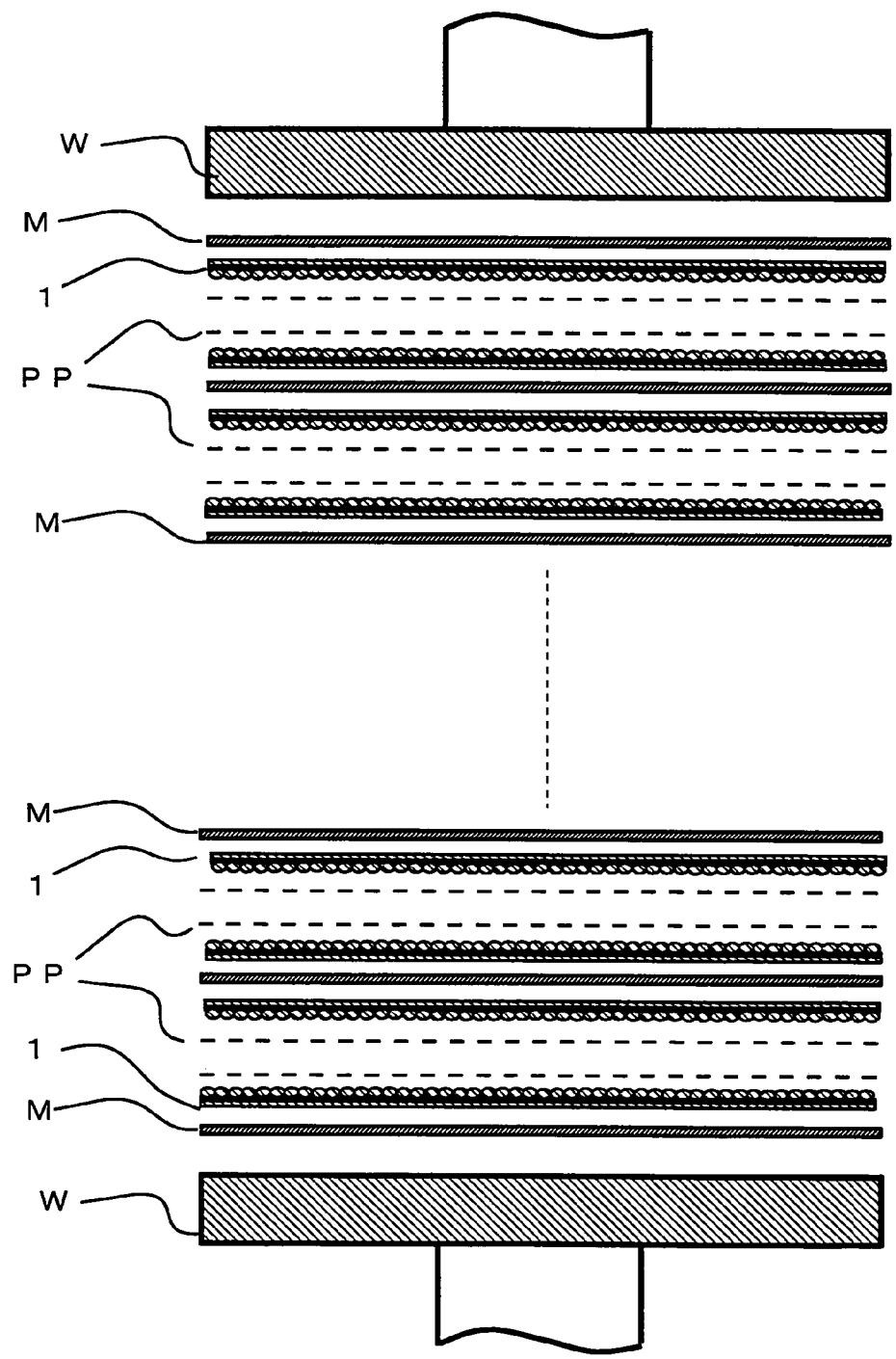
FIG. 4 shows a schematic diagram showing the lay-up configuration at the time of pressing by use of the electrodeposited copper foils with carrier foil according to the present invention.

Description is made on the way of use of the double-sided electrodeposited copper foil with carrier foil 1 in manufacturing copper clad laminates in comparison with the case where the electrodeposited copper foil with carrier foil 1 is used. As FIG. 4 shows, the manufacture of double-sided copper clad laminates, based on the use of the electrodeposited copper foils with carrier foil 1, is conducted as follows: between the top and bottom press plates W, there is repeatedly laminated a sequence of a mirror finished end plate M made of such a heat resistant material as stainless steel, a sheet of the electrodeposited copper foil with carrier foil 1, a sheet or a plurality of sheets of prepreg PP, a sheet of the electrodeposited copper foil with carrier foil 1, and an end plate M (this process of assembling is commonly referred to as "layup"); the press plates are heat at a high temperature; the resin component of the prepreg is melted by sandwiching with the press plates; and the sheets of the electrodeposited copper foil with carrier foil 1 and the prepreg sheets PP are subjected to high temperature press adhesion.

Figure 5:
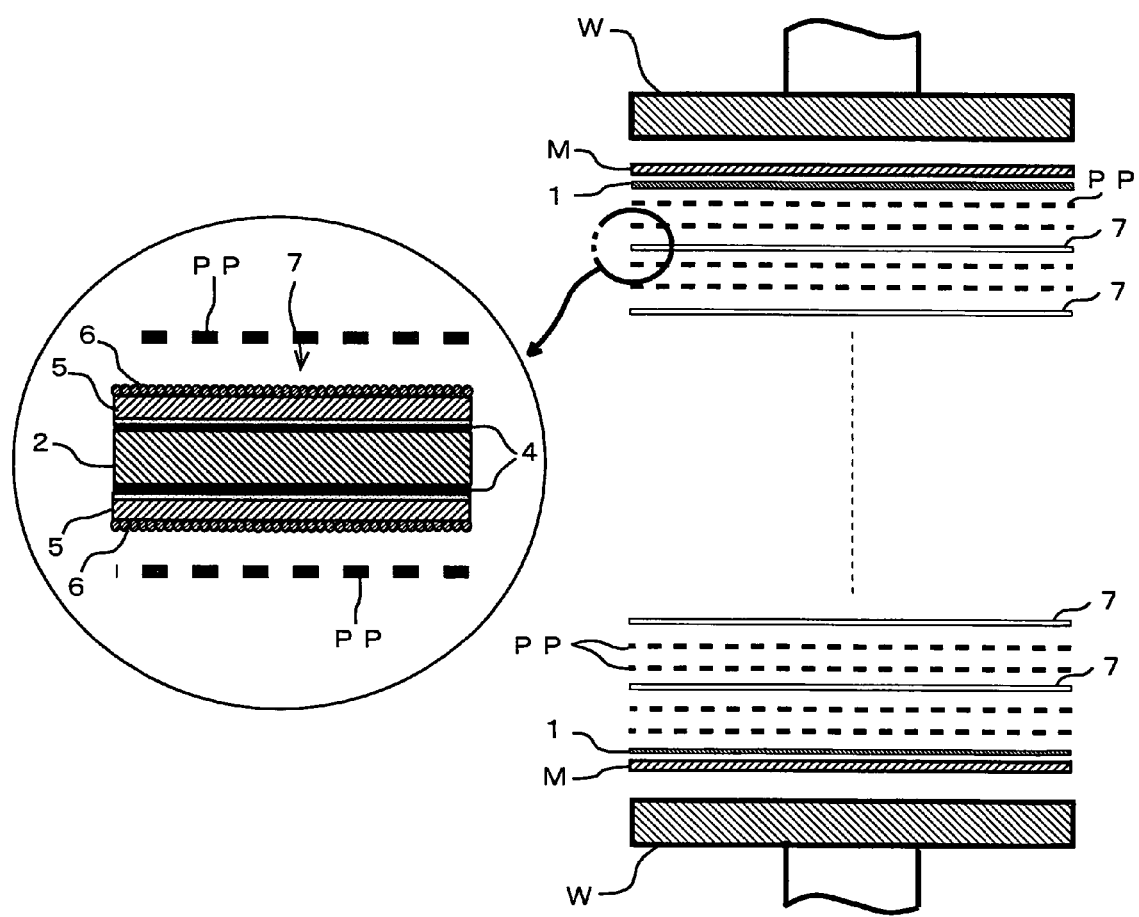
FIG. 5 shows a schematic diagram showing the lay-up configuration at the time of pressing by use of the double-sided electrodeposited copper foils with carrier foil according to the present invention.

On the contrary, the use of the double-sided electrodeposited copper foil with carrier foil 7 permits omitting the end plates M in the manufacture of copper clad laminates, and furthermore, completely preventing the foreign matter contamination of the glossy surfaces of the copper foils in pressing. More specifically, as FIG. 5 shows, the use of the double-sided electrodeposited copper foil with carrier foil 7 permits omitting all the end plates M arranged in the intermediate layers, by using either conventional electrodeposited copper foil or the electrodeposited copper foil with carrier foil 1 for the uppermost and undermost layers in the layup arrangement and by using the double-sided electrodeposited copper foil with carrier foil 7 for the other intermediate layers; thus, disassembling on completion of pressing can be made by peeling at the adhesive interface layers 4.

No use of the end plates in the intermediate layers permits increasing the number of layers of the double-sided electrodeposited copper foil with carrier foil 7 and prepregs PP that can be contained in the daylight between the press plates W, by the sum thickness corresponding to the omitted end plates M, and accordingly increasing the number of the sheets of the copper clad laminates that can be formed in one pressing. Additionally, the heat conductance is also improved, and hence the productivity can be improved. The end plates M of 0.8 mm to 3.0 mm in thickness are usually used; thus, in consideration of the fact that while omitting some thereof, the layup can be made solely with the double-sided electrodeposited copper foil with carrier foil 7 of the order of 73 to 230 μm in the total thickness of one sheet and the prepreg of 30 to 180 μm in the thickness of one sheet, it is apparent that an extremely large productivity improvement effect can be achieved.

In the next place, description will be made below on the manufacture method of the electrodeposited copper foil with carrier foil or the double-sided electrodeposited copper foil with carrier foil, both having been described above. The manufacture method of the electrodeposited copper foil with carrier foil and the manufacture method of the double-sided electrodeposited copper foil with carrier foil are fundamentally the same, and are different from each other only as to whether an electrodeposited copper layer is formed on one face of the carrier foil, or electrodeposited copper layers are formed on both faces of the carrier foil. Accordingly, the following manufacture method will be described to be commonly applicable to both cases. The following individual processes are described in due order.

In the first place, the acid washing treatment process that is described as (a) in the claims is described. The acid treatment process is conducted for the purpose of the degreasing treatment in which the oil and fat component attached to the carrier foil is completely removed and for the purpose of removing the surface oxidation layer when metal foil has been used. By making the carrier foil pass through the acid solution concerned, the cleaning of the carrier foil is conducted so that the uniform electrodeposition and the like can be ensured in the subsequent processes. In the acid washing treatment, a variety of solutions including hydrochloric acid based solutions, sulfuric acid based solutions, sulfuric acid-hydrogen peroxide based solutions and the like can be used, and it is not necessary to set any particular limitation. As for the concentrations and temperatures of the solutions, it is sufficient that these quantities are adjusted according to the characteristics of the particular production lines. Furthermore, even in the case where copper foil is used as carrier foil, the acid washing treatment is not necessarily needed if the copper foil is free from surface oxidation and maintains a clean surface condition.

Then, a preliminary metal layer is formed on the surface of the carrier that is through with the acid treatment, by use of an electrochemical technique. This is the preliminary metal layer formation process as described as (b). For the formation of the preliminary metal layer, an electrochemical technique, or physical techniques including the vapor deposition method, sputtering method and the like can be adopted, and there is no need to set any particular limit for the formation method thereof. The term "an electrochemical technique" as described here is associated with the fact that either the electrolytic plating method or the electroless plating method can be applied to the formation of the preliminary metal layer. For example, when a nickel layer is formed by the use of the electrolytic plating method, those solutions which are used as nickel plating solutions can be extensively used. Here can be cited the following conditions as examples: <1> the condition in which nickel sulfate is used with the nickel concentration of 5 to 30 g/l, the solution temperature is 20 to 50° C., pH is 2 to 4, the current density is 0.3 to 10 A/cm$^2$; <2> the condition in which nickel sulfate is used with the nickel concentration of 5 to 30 g/l, potassium pyrophosphate is used in the concentration of 50 to 500 g/l, the solution temperature is 20 to 50° C., pH is 8 to 11, the current density is 0.3 to 10 A/cm$^2$; <3> the condition in which nickel sulfate is used with the nickel concentration of 10 to 70 g/l, boric acid is used in the concentration of 20 to 60 g/l, the solution temperature is 20 to 50° C., pH is 2 to 4, the current density is 1 to 50 A/cm$^2$; and in addition to these conditions, the general Watt bath condition, and the like. As for the solutions used in the electroless plating method, there is not particular limitations so that a wide variety of solutions including commercial solutions can be used.

In the preliminary metal layer formation process, on completion of the preliminary metal layer formation, the preliminary metal layer is subjected to the anodic treatment to be oxidized and is thereby converted to a metal oxide layer. This is the metal oxide layer formation process as described as (c). The reason for the adoption of the anodic treatment, as is made here, is that thermal oxidation of metal causes a problem of the oxidation of the copper foil used as carrier foil that leads to failure in ensuring the appearance quality of the product. Additionally, this is because, as for the anodic treatment as termed here, it does not matter whether the anodic treatment is involved in the case where a barrier type oxide layer that is a uniform oxide layer free from pores is formed or with the case where a porous oxide layer that is made of an anodic oxide coating film with generated pores is formed. The conditions for the solutions used for the anodic treatment are not needed to be limited particularly, and it suffices that the conditions conforming with the characteristics of the adopted processes are adopted. For example, in the above described case where a nickel layer is to be subjected to anodic oxidation, the following conditions are adopted: the solution temperature is 25° C. to 30° C.; the sulfuric acid solution is used in the concentration of 0.5 mol/l to 1.0 mol/l; and the treatment conditions are: the current density is 10 $A/dm^2$ to 15 $A/dm^2$, and the treatment time falls in the range not shorter than 5 seconds.

On completion of the metal oxide layer formation process, the organic material layer OL is formed on the metal oxide layer ML, and this is the organic material layer formation process that is described as (d). The formation of the organic material layer OL on the metal oxide layer ML can be conducted by dissolving an above described organic material in a solvent and soaking the metal oxide layer ML into the solvent together with the carrier foil, or by applying the showering method, spray method, dropping method, electrodeposition method and the like to the surface on which the organic material layer is to be formed; it is unnecessary to adopt any particularly limited method. In this case, it is preferable that for all the organic materials described above, the concentration of the organic material in the solvent falls in the range from 0.01 g/l to 10 g/l, and the solution temperature falls in the range from 20 to 60° C. The organic material is present on the metal oxide layer ML as adsorbed thereon, and hence the concentration of the organic material in the solvent is not needed to be particularly limited, and it does not essentially matter by whether the concentration is high or low.

Additionally, the formation of the adhesive interface layer based on organic materials can also be made by appropriately combining the above described organic materials, and can also be made by repeating the above described formation method. In this way, it becomes possible to control in a higher precision the thickness or the adsorbed quantity of the organic material layer OL. Fundamentally, the organic material concentration is determined according to the speed of the production line. The time period, during which the organic material dissolved in the solvent is allowed to contact with the surface on which the organic material layer OL is formed, is also determined by the speed of the production line, and the practical contact time period ranges from 5 to 60 seconds.

Consideration of these facts results in the finding that with the organic material concentration that is lower than the lower limit concerned of 0.01 g/l, the organic material adsorption in a short time period becomes difficult, furthermore the thickness of the formed organic material layer is varied, and the product quality stabilization becomes impossible. On the other hand, even with the concentration exceeding the upper limit of 10 g/l, the adsorption rate of the organic material is not particularly increased according to the added amount, and hence such high concentrations are not preferable for the viewpoint of production cost.

On completion of the metal oxide layer formation process, the electrodeposited copper foil layer 3 is formed. The electrodeposited copper foil layer 3 is usually composed of the bulk copper layer 5 on which circuit shapes are finally formed and the copper microparticle layer 6 that yields the anchor effect to improve the adhesion to the resin substrate when a copper clad laminate is formed. The process in which the electrodeposited copper foil layer 3 is formed on the organic material layer OL of the adhesive interface layer 4 is the electrodeposited copper foil layer formation process described as (e).

Accordingly, the electrodeposited copper foil layer formation process is composed of the formation process of the bulk copper layer 5 and the deposition formation process of the copper microparticle layer 6. For the formation of the bulk copper layer 5, there is used a solution that can be used as a copper ion supply source including copper sulfate based solutions, copper pyrophosphate based solutions and the like, and there is no particular limitation for the solution. For example, as for the copper sulfate based solutions, the conditions are such that the copper concentration is 30 to 100 g/l, the sulfuric acid concentration is 50 to 200 g/l, the solution temperature is 30 to 80° C., the current density is 1 to 100 $A/dm^2$; and as for the copper pyrophosphate based solutions, the conditions are such that the copper concentration is 10 to 50 g/l, the potassium pyrophosphate concentration is 100 to 700 g/l, the solution temperature is 30 to 60° C., pH is 8 to 12, the current density is 1 to 10 $A/dm^2$; and other additives are used according to need. The copper component to from the bulk copper layer 5 is electrolytically deposited on the adhesive interface layer 4 uniformly, and in a flat and smooth manner in the following way: the carrier foil 2 on which the adhesive interface layer 4 has been formed is soaked into the solution concerned, the anode electrode is arranged in parallel with and with a certain separation from the surface of the carrier foil 2 on which the adhesive interface layer is formed, and the carrier foil 2 itself is polarized as the cathode.

Subsequently, on completion of the bulk copper layer 5 formation, then the copper microparticle layer 6 is formed on the bulk copper layer 5. Furthermore, the deposition formation process of the copper microparticle layer 6 is generally composed of the process in which copper microparticles are deposited on the bulk copper layer 5 and the seal plating process in which the copper microparticles are made to be prevented from exfoliation.

In the process for depositing copper microparticles on the bulk copper layer 5, copper solutions, as similar to the above described solutions used for the bulk copper formation, are used as the copper ion supply source. For the electrolysis conditions applied to the bulk copper formation, however, the leveling plating conditions are adopted, whereas for the electrolysis conditions as referred to here, the burn plating conditions are adopted. Accordingly, the solution concentration applied to the deposition of copper microparticles on the bulk copper layer 5 is made to be lower than that applied to the formation of the bulk copper layer 5, so as to make it easy to bring forth the burn plating conditions. The burn plating conditions are not particularly limited, but are determined in consideration of the characteristics of the production line. For example, when a copper sulfate based solution is used, the following conditions are adopted: the copper concentration is 5 to 20 g/l, the sulfuric concentration is 50 to 200 g/l, other additives (α-naphthoquinoline, dextrin, glue, thiourea and the like) are added according to need, the solution temperature is 15 to 40° C., the current density is 10 to 50 $A/dm^2$.

The seal plating to prevent the exfoliation of the copper microparticles is a process in which for the purpose of preventing the exfoliation of the deposited copper microparticles, copper is uniformly deposited under the leveling plating conditions so as to cover the-copper microparticles.

Accordingly, copper solutions, as similar to the above described solutions used for the bulk copper formation, can be used here as the copper ion supply source. The leveling plating conditions are not particularly limited, but are determined according to the characteristics of the production line. For example, when a copper sulfate based solution is used, the following conditions are adopted: the copper concentration is 50 to 80 g/l, the sulfuric acid concentration is 50 to 150 g/l, the solution temperature is 40 to 50° C., the current density is 10 to 50 A/dm$^2$. As described above the copper microparticle layer 6 is formed.

If the formation of the bulk copper layer 5 is omitted in the above described electrodeposited copper foil layer formation process, an electrodeposited copper foil layer that is composed only of copper microparticles can be formed. Accordingly, in the claims, there is found a description of "a bulk copper layer according to need."

On completion of the electrodeposited copper foil layer formation, passivation and additional necessary surface finishing are conducted on the surfaces of the outermost layers of the carrier foil and electrodeposited copper foil layer. This is the surface finishing process that is described as (f). The surface finishing process has the purpose that the surface of the electrodeposited copper foil layer is prevented from oxidative corrosion so that no troubles occur in the production processes of copper clad laminates and printed wiring boards. The method used for the passivation can adopt, without problems, either the organic passivation that uses benzotriazole, imidazole and the like or the inorganic passivation that uses zinc, chromate, zinc alloy and the like. The passivation type can be selected according to the intended use of the electrodeposited copper foil with carrier foil. For the organic passivation, the soak coating, showering coating electrodeposition and like methods of organic passivating agents can be adopted. For the inorganic passivation, a method which electrolytically deposits the passivating elements on the surface of the electrodeposited copper foil layer, and the so-called displacement deposition method and other methods can be used. For example, for the zinc passivation treatment, the zinc pyrophosphate plating bath, the zinc cyanide plating bath, the zinc sulfate plating bath and the like can be used. For example, when the zinc pyrophosphate plating bath is used, the following conditions are adopted: the zinc concentration is 5 to 30 g/l, the zinc pyrophosphate concentration is 50 to 500 g/l, the solution temperature is 20 to 50° C., the current density is 0.3 to 10 A/dm$^2$.

"An additional necessary surface finishing" means a treatment in which a silane coupling agent and the like are used for the purpose of improving the chemical adhesion between the resin substrate and the copper foil layer. For example, in the case where a silane coupling agent is used, any of an olefin functional silane, an epoxy-functional silane, an acryl-functional silane, an amino-functional silane and a mercapto-functional silane can be used. An aqueous solution containing any one of these silanes in the content of 0.5 to 10 g/l is prepared, and is brought into contact with the outer surface layer, subjected to passivation, of the electrodeposited copper foil layer and then subjected to heat drying.

Furthermore, in the claims, two manufacture methods are disclosed as the direct formation methods of the metal oxide layer in which a dry deposition method is used for the formation of the metal oxide layer, without going through the preliminary metal layer formation process.

One is "the manufacture method of the electrodeposited copper foil with carrier foil, characterized in that the method includes the following individual processes: (a) an acid washing treatment process for cleaning a carrier foil; (b) a metal oxide layer formation process in which a metal oxide layer, to constitute an adhesive interface layer, is formed by use of the vapor deposition method on one face of the carrier foil that has been through the acid washing treatment; (c) an organic material layer formation process in which an organic material layer is formed on the metal oxide layer; (d) an electrodeposited copper foil layer formation process in which on the organic material layer, a bulk copper layer and a copper microparticle layer which constitute an electrodeposited copper foil layer and are provided according to need are formed; (e) a surface finishing process in which on the surfaces of the outermost layers of the carrier foil and electrodeposited copper foil layer, passivation and additional necessary surface finishing are appropriately conducted." The other is "the manufacture method of the double-sided electrodeposited copper foil with carrier foil, characterized in that the method includes the following individual processes: (a) an acid washing treatment process for cleaning a carrier foil; (b) a metal oxide layer formation process in which metal oxide layers, to constitute adhesive interface layers, are formed by use of the vapor deposition method on both faces of the carrier foil that has been through the acid washing treatment; (c) an organic material layer formation process in which organic material layers are formed on the metal oxide layers formed on both faces; (d) an electrodeposited copper foil layer formation process in which on the organic material layers formed on both faces, bulk copper layers and copper microparticle layers which constitute electrodeposited copper foil layers and are provided according to need are formed; (e) a surface finishing process in which on the surfaces of the outermost layers of the carrier foils and electrodeposited copper foil layers, passivation and additional necessary surface finishing are appropriately conducted."

The vapor deposition method as referred to here includes the concepts of the classical vapor deposition method, as an first example, in which metal oxides are heated and evaporated under vacuum and made to get down onto the object to be coated, the sputtering deposition in which the element ejected by sputtering a target made of a metal oxide is made to get down onto the object to be coated, and the like. The application of the vapor deposition methods is useful in the cases where are formed the layers of the metal oxides such as titanium oxide and tungsten oxide that are difficult to be formed by the electrochemical techniques that have been described above. The descriptions for the other processes are similar to those that have been described above, and hence are omitted here.

According to the manufacture methods described above, the electrodeposited copper foil with carrier foil and the double-sided electrodeposited copper foil with carrier foil are obtained, and the copper clad laminates are manufactured using these foils under the high temperature press conditions in which the temperature is 200° C. or higher. The copper clad laminates as referred to here are the copper clad laminates in a condition prior to carrier foil peeling, and hence are not the mere copper clad laminates, in a strict sense of the term. These copper clad laminates permit the easy carrier peeling even if they are manufactured under the high temperature press conditions, in a contrast to the cases where the use of the conventional electrodeposited copper foils with carrier foil does not permit the carrier foil peeling.

BEST MODE FOR CARRYING OUT THE INVENTION

Below are shown the Examples in which the electrodeposited copper foil with carrier foil or the double-sided electrodeposited copper foil with carrier foil according to the present invention was manufactured; using the products obtained, some copper clad laminates were manufactured by varying the press temperature, and the measurement results for these laminates of the peel strength between the carrier foil layer and the copper foil layer will be presented.

EXAMPLE 1

As for the present example, the results are described which are involved in the manufacture of the electrodeposited copper foil with carrier foil 1 shown in FIG. 1. Here, an electrodeposited copper foil of 35 µm in thickness, classified as grade 3, was used for the carrier foil 2, and an electrodeposited copper foil layer 3 of 5 µm in thickness was formed on the glossy surface of 0.21 µm in average roughness (Ra). In what follows, following the order of the individual processes, production conditions are described. Incidentally, in the processes described below in which the electrolysis method was used, a stainless plate was used for the anode electrode unless the materials are particularly specified.

At the beginning, the carrier foil 2 was made to get into the acid washing process. In the acid washing process, the inside of an acid washing vessel was filled with a diluted sulfuric acid solution of 150 g/l in concentration and of 30° C. in solution temperature; the carrier foil 2 was soaked into the solution with the soaking time set at 30 seconds, the oil and fat component was removed, the superfluous surface oxide coating was removed, and then the carrier foil 2 was washed with water.

The carrier foil 2 that got out from the acid washing process was subjected to the nickel layer formation on the glossy surface in the preliminary metal layer formation process. In the present Example, a nickel layer was formed by the electrolysis method. The nickel plating solution used was a Watt bath containing nickel sulfate in the content of 240 g/l, nickel chloride in the content of 454 g/l, and boric acid in the content of 30 g/l; the electrolysis conditions were that the solution temperature was 40° C., pH was 5, the current density was 10 A/dm$^2$, the electrolysis time was 20 seconds, and a nickel plate was used for the counter electrode. On completion of the nickel layer formation, the carrier foil 2 was washed with water and dried.

On completion of the nickel layer formation in the preliminary metal layer formation process, the nickel layer was oxidized by the anodic treatment in the metal oxide layer formation process. In the present Example, the solution used for the anodic treatment was a sulfuric acid solution of 25° C. in solution temperature and 0.5 mol/l in concentration; and the adopted treatment conditions were that the current density was 10 A/dm$^2$ and the treatment time was 30 seconds. In this way, the nickel oxide layer ML constituting the adhesive interface layer 4 was formed and washed with water.

On completion of the formation of the nickel oxide layer ML constituting the adhesive interface layer 4, the organic material layer OL was successively formed thereon in the organic material layer formation process. The organic material layer OL formation was conducted on the surface where the nickel oxide layer ML was formed by spraying, with the aid of showering for 30 seconds, of an aqueous solution at 40° C. in solution temperature and at pH5, containing CBTA in the concentration of 5 g/l.

On completion of the formation of the organic material layer OL, the operation gets into the electrodeposited copper foil layer formation process for forming the electrodeposited copper foil layer 3 on the surface thereof. The electrodeposited copper foil layer formation process of the present invention is composed of the below described bulk copper layer formation process and copper microparticle formation process (inclusive of the seal plating process).

In the first place, in the bulk copper layer formation process, the formation of the bulk copper layer 5 was conducted. For the formation of the bulk copper layer 5, a sulfuric acid solution was used in which the concentrations of sulfuric acid and copper were 150 g/l and 65 g/l respectively and the solution temperature was 45° C. In a vessel filled with the solution, a flat plate anode electrode was arranged in parallel with the surface on which the adhesive interface layer 4 was formed, the carrier foil 2 itself was polarized as cathode, electrolysis was conducted for 60 seconds under the leveling plating condition of the current density of 15 A/dm$^2$, and thus the bulk copper layer 5 was formed.

On completion of the formation of the bulk copper layer 5, in the copper microparticle formation process, the copper microparticles 6 were first formed by deposition on the surface of the bulk copper layer 5. In the process in which the copper microparticles 6 were formed by deposition on the bulk copper layer 5, a copper sulfate solution similar to that used in the above described formation of the bulk copper layer 5 was used in which the solution composition was 100 g/l sulfuric acid, 18 g/l copper, and the solution temperature was 25° C. Besides, in a vessel filled with the solution, the flat plate anode electrode was arranged in parallel with the surface on which the bulk copper layer 5 was formed, the carrier foil 2 itself was polarized as cathode, electrolysis was conducted for 10 seconds under the burn plating condition of the current density of 10 A/dm$^2$, and thus the deposition formation of the copper microparticles 6 was performed.

Furthermore, the seal plating process was conducted for preventing the exfoliation of the copper microparticles 6. In the seal plating process, exactly the same copper sulfate solution as that used in the above described formation of the bulk copper layer 5 was used, and the electrolysis was conducted for 20 seconds under the smooth plating conditions. In this way, the formation of the electrodeposited copper foil layer 3 was performed.

Then, on completion of the formation of the electrodeposited copper foil layer 3, in the surface finishing process, the passivation was conducted and the surface of the copper microparticles in the electrodeposited copper foil was subjected to the silane coupling agent treatment. In the passivation in the present Example, zinc was used as the passivating element, and not only the surface of the electrodeposited copper foil layer 3 but also the surface of the carrier foil 2 was simultaneously passivated. Accordingly, here were used zinc plates, which are soluble electrode, as the anode electrodes, by arranging the zinc plates one each on the both sides of the carrier foil 2, and the zinc concentration balance was thereby maintained in the passivation treatment vessel; the zinc sulfate bath was used as the electrolyte in which the sulfuric acid and zinc concentrations were maintained respectively at 70 g/l and 20 g/l; and the solution temperature was set at 40° C., the current density was set at 15 A/dm$^2$, and the electrolysis time was set at 15 seconds. On completion of the passivation, washing with water was conducted.

Furthermore, for the purpose of rustproofing, the electrolytic chromate passivation was made over the zinc passivation. Electrolytically a chromate layer was formed on the zinc passivation layer. In this case, the electrolysis conditions were as follows: chromic acid 5.0 µl, pH11.5, solution temperature 35° C., current density 8 A/dm$^2$, electrolysis time 5 seconds. This electrolytic chromate passivation was made not only on the zinc passivated surface of the electrodeposited copper foil layer 3 but also simultaneously on the zinc passivated surface of the carrier foil 2.

On completion of the passivation, washing with water, and immediately, without drying the copper foil surface, the adsorption of the silane coupling agent was made only on the passivated layer of the nodularized surface of the electrodeposited copper foil layer 3, in a silane coupling agent treatment vessel. In this treatment, the solution composition was such that γ-glycidoxypropyltrimethoxysilane was added into ion exchanged water as solvent so as for the concentration to be 5 g/l. The adsorption treatment was performed by spraying the solution by showering against the copper foil surface.

On completion of the silane coupling agent treatment, as the final stage, the atmosphere in a drying treatment furnace was adjusted using an electric heater so as for the foil temperature to be 140°, the copper foil was made to pass through the heated furnace with a transit time of 4 seconds; thus, the copper foil was dehydrated and the condensation reaction of the silane coupling agent was promoted; then, the finished electrodeposited copper foil with carrier foil 1 was obtained.

By using the electrodeposited copper foil with carrier foil 1 thus obtained and 2 sheets of FR-4 prepreg of 150 μm in thickness, the layup was made as shown in FIG. 4 and thus the double-sided copper clad laminate was manufactured; the peel strength of the carrier foil, in the adhesive interface between the carrier foil layer 2 and the electrodeposited copper foil layer 3, was measured at 20 points. Incidentally, in this case, in the adhesive interface layers 4, the average thickness of the nickel oxide layers was 10 nm, and the average thickness of the organic material layer was 5 nm. The results for the peel strength measurement were as follows: the peel strength for the case where the press temperature in the manufacture of the copper clad laminate was 175° C.: 3.9 gf/cm (standard deviation 0.07 gf/cm); the peel strength for the case where the press temperature was 185° C.: 3.7 gf/cm (standard deviation 0.07 gf/cm); the peel strength for the case where the press temperature was 195° C.: 2.0 gf/cm (standard deviation 0.12 gf/cm); the peel strength for the case where the press temperature was 220° C.: 4.3 gf/cm (standard deviation 0.15 gf/cm).

EXAMPLE 2

As for the present example, the results are described which are involved in the manufacture of the double-sided electrodeposited copper foil with carrier foil 7 shown in FIG. 3. Here, a low-profile electrodeposited copper foil of 70 μm in thickness, classified as grade 3, was used for the carrier foil 2, and an electrodeposited copper foil layer 3 of 5 μm in thickness was formed on each of the glossy surface of 0.24 μm in average roughness (Ra) and the nodular surface of 0.82 μm in average roughness (Ra). In what follows, instead of describing the production conditions following the order of the individual processes, only the difference from those in Example 1 will be described, because the production conditions applied in the individual processes are fundamentally, exactly the same as those in Example 1.

The differences form Example 1 are as follows: in Example 1, an anode electrode was arranged on the side, except for the passivation process, but it is necessary to arrange anode electrodes on both sides of the carrier foil 2; and additionally, the silane coupling agent treatment is applied to both faces. Additionally, for the formation of the organic material layer OL, the soaking was made, together with the carrier foil, in the solution used in Example 1 and the contact time was 30 seconds.

By using the double-sided electrodeposited copper foil with carrier foil 7 thus obtained and 2 sheets of FR-4 prepreg of 150 μm in thickness, the layup was made as shown in FIG. 5 and thus the copper clad laminate was manufactured; the peel strength, in the adhesive interface 4 between the carrier foil layer 2 and the electrodeposited copper foil layer 3, was measured. The above described manufacture method omitting the endplates 4 was not applied to the copper clad laminate manufactured here, which was manufactured only for the purpose of measuring the peel strength between the carrier foil layer 2 and the electrodeposited copper foil layer 3. Accordingly, for the purpose of measuring the respective peel strengths between the electrodeposited copper foil layers 3 present on both sides of the carrier foil 2 and the carrier foil layer 2, the electrodeposited copper foil layer 3, on the side other than the side to be involved in measurement, was beforehand peeled and then the pressing into the copper clad laminate was made; the copper clad laminate thus obtained was used as the measurement specimen.

Then, the peel strength of the carrier foil 2 was measured at 20 points, for each of the adhesive interfaces 4 for the electrodeposited copper foil layer formed on the glossy surface side and nodular surface side of the carrier 2. As a result, in the case of the glassy side, the resulting peel strengths were as follows: the peel strength for the case where the press temperature in the manufacture of the copper clad laminate was 175° C.: 2.5 gf/cm (standard deviation 0.06 gf/cm); the peel strength for the case where the press temperature was 185° C.: 2.7 gf/cm (standard deviation 0.07 gf/cm); the peel strength for the case where the press temperature was 195° C.: 2.9 gf/cm (standard deviation 0.07 gf/cm); the peel strength for the case where the press temperature was 220° C.: 3.6 gf/cm (standard deviation 0.08 gf/cm).

On the other hand, in the case of the nodular surface side, the resulting peel strengths were as follows: the peel strength for the case where the press temperature in the manufacture of the copper clad laminate was 175° C.: 3.9 gf/cm (standard deviation 0.08 gf/cm); the peel strength for the case where the press temperature was 185° C.: 3.7 gf/cm (standard deviation 0.09 gf/cm); the peel strength for the case where the press temperature was 195° C.: 4.0 gf/cm (standard deviation 0.11 gf/cm); the peel strength for the case where the press temperature was 220° C.: 4.3 gf/cm (standard deviation 0.13 gf/cm).

COMPARATIVE EXAMPLE 1

In the present comparative example, an electrodeposited copper foil with carrier foil was manufactured for use in comparison in which the organic material layer OL was not formed but only the metal oxide layer ML formed of nickel oxide was provided as the adhesive interface layer 4 of Example 1. The electrodeposited copper foil with carrier foil comprising the organic adhesive interface layer, for use in comparison, is the product in which only the metal oxide layer ML was formed on the basis of the formation method, in Example 1, of the adhesive interface layer 4, and the organic material layer formation process was omitted, and otherwise similar processes were adopted. Accordingly, duplicate description will be avoided and only the evaluation results for the obtained electrodeposited copper foil with carrier foil will be presented.

A copper clad laminate was manufactured by using the electrodeposited copper foil with carrier foil thus obtained and 2 sheets of FR-4 prepreg of 150 μm in thickness, and the peel strength, in the adhesive interface between the carrier foil layer and the electrodeposited copper foil layer, was measured. Incidentally, the thickness of the involved adhesive interface layer that was a nickel oxide layer was 10 nm in average. The measurement results for the peel strength at 20 points were as follows: the peel strength for the case where the press temperature in the manufacture of the copper clad laminate was 175° C.: 4.5 gf/cm (standard deviation 0.11 gf/cm); the peel strength for the case where the press temperature was 185° C.: 4.7 gf/cm (standard deviation 0.15 gf/cm); the peel strength for the case where the press temperature was 195° C.: 4.9 gf/cm (standard deviation 0.36 gf/cm); the peel strength for the case where the press temperature was 220° C.: 5.3 gf/cm (standard deviation 0.80 gf/cm).

COMPARATIVE EXAMPLE 2

In the present comparative example, an electrodeposited copper foil with carrier foil was manufactured for use in comparison in which the organic adhesive interface made of an organic material was used for the adhesive interface layer 4 shown in FIG. 1. The electrodeposited copper foil with carrier foil comprising the organic adhesive interface layer, for use in comparison, is the product in which the nickel layer formation process and the nickel oxide layer formation process in Example 1 were replaced by the organic material layer formation process, and otherwise similar processes were adopted. Accordingly, duplicate description will be avoided and description will be made only on the organic adhesive interface formation.

In the organic adhesive interface formation process, the following treatment solution was sprayed against one face of the carrier foil having got our from the acid washing process. The treatment solution used in this case contained carboxybenzotriazole (CBTA) in the concentration of 5 g/l, with the solution temperature of 40° C. and pH5, and was sprayed to be adsorbed; thus the organic material layer was formed on the glossy surface side of the carrier foil.

A copper clad laminate was manufactured by using the electrodeposited copper foil with carrier foil thus obtained, comprising an organic material layer, and 2 sheets of FR-4 prepreg of 150 μm in thickness, and the peel strength, in the adhesive interface between the carrier foil layer and the electrodeposited copper foil layer, was measured. The measurement results for the peel strength were as follows: the peel strength for the case where the press temperature in the manufacture of the copper clad laminate was 175° C.: 3.7 gf/cm (standard deviation 0.07 gf/cm); the peel strength for the case where the press temperature was 185° C.: 12.8 gf/cm (standard deviation 0.09 gf/cm); the peel strength for the case where the press temperature was 195° C.: 106.3 gf/cm (standard deviation 0.15 gf/cm); in the case where the press temperature was 220° C., no peeling was possible.

When the electrodeposited copper foil with carrier foil or the double-sided electrodeposited copper foil with carrier foil described in Examples is used, the carrier foil can be easily peeled even if the press temperature for the copper clad laminate exceeds 200° C., and furthermore the peel strength is stabilized as can be seen from the standard deviation values. On the contrary, as for the electrodeposited copper foil with carrier foil, provided with only the organic adhesive layer, as has been revealed, the peel strength of the carrier foil is increased, as the press temperature for the copper clad laminate is increased, and the peeling itself becomes impossible with the press temperature exceeding 200° C. Additionally, as for the electrodeposited copper foil with carrier foil, provided with only the metal oxide layer, the peeling itself is possible even at the press temperatures for the copper clad laminate exceeding 200° C., but the dispersion of the peel strength values becomes large as can be seen from consideration of the standard deviation values.

Industrial Application

The use of the electrodeposited copper foil with carrier foil or the double-sided electrodeposited copper foil with carrier foil according to the present invention permits easy peeling of the carrier foil layer and the electrodeposited copper foil even after manufacturing Teflon boards, polyimide boards and the like that require the pressing at the high temperatures of 200° C. or higher, and also has made it possible to remarkably reduce the dispersion of the peel strength. Consequently, the formation of such ultra-thin copper foils that have not hitherto been able to be applied to Teflon boards and polyimide boards, by use of the electrodeposited copper foil with carrier foil or the double-sided electrodeposited copper foil with carrier foil according to the present invention, permits an drastic improvement of the product quality and makes it easy to form fine pitch circuits.

What is claimed is:

1. An electrodeposited copper foil comprising:
 a carrier foil;
 an adhesive interface layer laying on one face of the carrier foil; and
 an electrodeposited copper foil layer laying on the adhesive interface layer,
 wherein the adhesive interface layer comprises a metal oxide layer and an organic material layer.

2. The electrodeposited copper foil according to claim 1, wherein the metal oxide layer is at least 1 nm thick and is an oxide of nickel, chromium, titanium, magnesium, iron, cobalt, or tungsten, or an alloy thereof.

3. The electrodeposited copper foil according to claim 1, wherein the organic material layer is from 1 nm to 1 μm thick.

4. The electrodeposited copper foil according to claim 1, wherein the carrier foil is formed from copper and has a thickness of from 12 μm to 70 μm.

5. The electrodeposited copper foil according to claim 1, wherein the electrodeposited copper foil layer comprises a copper microparticle layer.

6. The electrodeposited copper foil according to claim 1, wherein the organic material layer is formed from at least one organic material selected from the group consisting of nitrogen containing organic compounds, sulfur containing organic compounds and carboxylic acids.

7. The electrodeposited copper foil according to claim 5, wherein the electrodeposited copper foil layer further comprises a surface finishing layer.

8. The electrodeposited copper foil of claim 1, wherein the metal oxide layer lays adjacent to the carrier foil and the organic material layer lays adjacent to the metal oxide layer.

9. A double-sided electrodeposited copper foil comprising:
 a first electrodeposited copper foil layer;
 a first adhesive interface layer laying on a face of the first electrodeposited copper foil layer;
 a carrier foil laying on the first adhesive interface layer;
 a second adhesive interface layer laying on the carrier foil; and
 a second electrodeposited copper foil layer laying on the second adhesive interface layer, wherein the first and second adhesive layers each comprise a metal oxide layer and an organic material layer.

10. The double-sided electrodeposited copper foil according to claim 9, wherein each metal oxide layer is at least 1 nm thick and is an oxide of nickel, chromium, titanium, magnesium, iron, cobalt, or tungsten, or an alloy thereof.

11. The double-sided electrodeposited copper foil according to claim 9, wherein each organic material layer is from 1 nm to 1 µm thick.

12. The double-sided electrodeposited copper foil according to claim 9, wherein the carrier foil is formed from copper and has a thickness of from 70 µm to 210 µm.

13. The double-sided electrodeposited copper foil according to claim 9, wherein the first and second electrodeposited copper foil layers each comprise a copper microparticle layer.

14. The double-sided electrodeposited copper foil according to claim 9, wherein each organic material layer is formed from at least one organic material selected from the group consisting of nitrogen containing organic compounds, sulfur containing organic compounds and carboxylic acids.

15. The double-sided electrodeposited copper foil according to claim 13, wherein each of the first and second electrodeposited copper foil layers further comprise a surface finishing layer.

16. The electrodeposited copper foil of claim 9, wherein each metal oxide layer lays adjacent to the carrier foil and each organic material layer lays adjacent to each metal oxide layer.

17. A method for producing the electrodeposited copper foil according to claim 1, comprising:
   (a) cleaning the carrier foil with an acid washing treatment process;
   (b) oxidizing one face of the carrier foil to form a preliminary metal layer;
   (c) forming the metal oxide layer by treating the preliminary metal layer with an anodic treatment;
   (d) forming the organic material layer on the metal oxide layer with an organic material layer formation process;
   (e) forming an electrodeposited copper foil layer on the organic material layer, the electrodeposited copper foil comprising a bulk copper layer and a copper microparticle layer; and
   (f) treating the surfaces of the outermost layers of the outermost layers of the electrodeposited copper foil with a passivation step, a surface treatment step, or a passivation step and a surface treatment step.

18. A method for producing the double-sided electrodeposited copper foil according to claim 9, comprising:
   (a) cleaning the carrier foil with an acid washing treatment process;
   (b) oxidizing both faces of the carrier foil to form two preliminary metal layers;
   (c) forming each metal oxide layer by treating each preliminary metal layer with an anodic treatment;
   (d) forming the organic material layer on each metal oxide layer with an organic material layer formation process;
   (e) forming the first and second electrodeposited copper foil layers on the organic material layers, the first and second electrodeposited copper foil layers each comprising a bulk copper layer and a copper microparticle layer; and
   (f) treating the surfaces of the outermost layers of the outermost layers of the electrodeposited copper foil with a passivation step, a surface treatment step, or a passivation step and a surface treatment step.

19. A method for producing the electrodeposited copper foil according to claim 1, comprising:
   (a) cleaning the carrier foil with an acid washing treatment process;
   (b) forming the metal oxide layer on one face of the carrier with a vapor deposition process;
   (c) forming the organic material layer on the metal oxide layer with an organic material layer formation process;
   (d) forming an electrodeposited copper foil layer on the organic material layer, the electrodeposited copper foil comprising a bulk copper layer and a copper microparticle layer; and
   (e) treating the surfaces of the outermost layers of the electrodeposited copper foil with a passivation step, a surface treatment step, or a passivation step and a surface treatment step.

20. A method for producing the double-sided electrodeposited copper foil according to claim 9:
   (a) cleaning the carrier foil with an acid washing treatment process;
   (b) forming a metal oxide layer on each face of the carrier foil with a vapor deposition process;
   (c) forming an organic material layer on each metal oxide layer with an organic material layer formation process;
   (d) forming the first and second electrodeposited copper foil layers on the organic material layers, the first and second electrodeposited copper foil layers each comprising a bulk copper layer and a copper microparticle layer; and
   (e) treating the surfaces of the outermost layers of the electrodeposited copper foil with a passivation step, a surface treatment step, or a passivation step and a surface treatment step.

21. A copper clad laminate comprising the electrodeposited copper foil according to claim 1.

22. A copper clad laminate comprising the double-sided electrodeposited copper foil according to claim 9.

* * * * *